US007811464B2

(12) United States Patent
Kume

(10) Patent No.: US 7,811,464 B2
(45) Date of Patent: *Oct. 12, 2010

(54) PREFERENTIAL ETCHING METHOD AND SILICON SINGLE CRYSTAL SUBSTRATE

(75) Inventor: Fumitaka Kume, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 520 days.

This patent is subject to a terminal disclaimer.

(21) Appl. No.: 11/795,876

(22) PCT Filed: Jan. 23, 2006

(86) PCT No.: PCT/JP2006/300928

§ 371 (c)(1),
(2), (4) Date: Jul. 24, 2007

(87) PCT Pub. No.: WO2006/080264

PCT Pub. Date: Aug. 3, 2006

(65) Prior Publication Data

US 2008/0069756 A1 Mar. 20, 2008

(30) Foreign Application Priority Data

Jan. 27, 2005 (JP) ............................. 2005-020094

(51) Int. Cl.
*B44C 1/22* (2006.01)
*H01L 21/302* (2006.01)

(52) U.S. Cl. ........................... 216/99; 216/83; 216/103; 438/745; 438/753

(58) Field of Classification Search .................... 216/83, 216/99, 103; 438/745, 753
See application file for complete search history.

(56) References Cited

U.S. PATENT DOCUMENTS 7,642,198 B2 * 1/2010 Sato ........................... 438/753
2004/0089225 A1 * 5/2004 Ono et al. ..................... 117/19
2005/0112893 A1 * 5/2005 Koyata et al. ............... 438/692
2006/0191468 A1 8/2006 Hoshi et al.

FOREIGN PATENT DOCUMENTS

| JP | A 59-94828 | 5/1984 |
| JP | A 4-209532 | 7/1992 |
| JP | A 5-226203 | 9/1993 |
| JP | A 7-263429 | 10/1995 |

(Continued)

OTHER PUBLICATIONS

Oct. 20, 2009 Office Action issued in Japanese Patent Application No. 2005-020094 (with partial translation).
Japanese Industrial Standard H 0609:1999; "Test methods of crystalline defects in silicon by preferential etch techniques," Feb. 29, 2000.

*Primary Examiner*—Shamim Ahmed
(74) *Attorney, Agent, or Firm*—Oliff & Berridge, PLC

(57) ABSTRACT

There is provided a preferential etching method wherein a preferential etchant which contains at least a hydrofluoric acid whose composition by volume falls within the range of 0.02 to 0.1, a nitric acid whose composition by volume falls within the range of 0.5 to 0.6, an acetic acid whose composition by volume falls within the range of 0.2 to 0.25, and water is used to etch a silicon single crystal substrate whose electrical resistivity is less than 10 mΩ·cm at a rate higher than 0.1 μm/min, thereby eliciting BMDs on a surface of the silicon single crystal substrate. As a result, the preferential etching method that can evaluate and utilize characteristics of crystal defects, especially BMDs in an ultralow-resistance silicon single crystal substrate whose electrical resistivity is less than 10 mΩ·cm, which cannot be readily detected by conventional techniques, by performing preferential etching using a chromeless etchant containing no harmful chrome can be provided.

8 Claims, 3 Drawing Sheets

FOREIGN PATENT DOCUMENTS

| | | |
|---|---|---|
| JP | A 11-238773 | 8/1999 |
| JP | A 2002-299345 | 10/2002 |
| JP | A 2004-83346 | 3/2004 |
| JP | A 2004-235350 | 8/2004 |
| JP | A-2004-315258 | 11/2004 |
| JP | A 2005-285987 | 10/2005 |

* cited by examiner

PREFERENTIAL ETCHING METHOD AND SILICON SINGLE CRYSTAL SUBSTRATE

TECHNICAL FIELD

The present invention relates to a preferential etching method for a silicon single crystal substrate fabricated based on, e.g., a Czochralski method and to a silicon single crystal substrate.

BACKGROUND ART

In recent years, an integration degree has been considerably improved in semiconductor integrated circuits, and superiority in not only a mechanical precision but also electrical characteristics has been demanded to obtain an integrated circuit having high performance/reliability/production yield. With such a demand, further rigorous conditions are set with respect to a quality of a silicon single crystal substrate (which will be simply referred to as a substrate in some cases) used to fabricate a device, e.g., a semiconductor integrated circuit, and fabricating a silicon single crystal substrate with an improved crystal quality has been demanded.

As a method of obtaining a silicon single crystal from a semiconductor polycrystal material, e.g., silicon, there is a Czochralski method (which will be referred to as a CZ method hereinafter. It is also called a pulling method.) of pulling a seed crystal from a raw material melt to obtain a silicon single crystal. The silicon single, crystal grown by this CZ method is subjected to slicing, lapping, chamfering, polishing, and others, thereby fabricating a silicon single crystal substrate. When this silicon single crystal substrate is subjected to a high-temperature heat treatment to eliminate defects in the vicinity of a substrate surface as much as possible, a quality of a device can be improved. A substrate taking advantage of such characteristics is a substrate having a denuded zone layer (a DZ layer), and its superiority has been substantially proved.

On the other hand, in a bulk portion of a substrate, increasing in gettering performance of capturing an impurity, e.g., a heavy metal by forming bulk micro defects (which will be referred to as BMDs hereinafter) made of, e.g., oxide precipitates with a high density is demanded. For example, when performing a device formation heat treatment with respect to a substrate, it is often the case that the substrate is exposed to contamination of impurities, e.g., heavy metals, the heavy metals adversely affect device operations, and hence it must be removed from the vicinity of a surface that is a device forming region. As a method of meeting this demand, there are gettering techniques.

In various gettering technologies, there is a method called intrinsic gettering (which is also called "internal gettering").

This method is a method of performing a precipitation heat treatment to form BMDs in a bulk of a silicon single crystal substrate that is not used for device formation, and utilizing these BMDs as getter sites for impurities, e.g., heavy metals. For example, although a silicon single crystal grown by the CZ method unavoidably contains oxygen at a fabrication stage, its oxygen concentration can be controlled, and silicon single crystal substrates having various oxygen concentrations can be fabricated in accordance with purposes. When a heat treatment is applied to such a silicon single crystal substrate, oxygen contained in the crystal is precipitated, and BMDs made of, e.g., oxide precipitates are formed in the substrate. Each circumference of the BMDs includes a distortion of a crystal lattice to no small extent, and this distortion captures an impurity, e.g., a heavy metal.

An oxide precipitate is apt to be formed in the silicon single crystal substrate when an electrical resistivity is low in case of a p-type substrate, and it is hard to be formed when an electrical resistivity is low in case of an n-type substrate. In recent years, a substrate with an ultralow resistance having an electrical resistivity that is less than 10 m$\Omega$·cm (0.01 $\Omega$·cm) is often used, and importance of density control of BMDs formed in the substrate with the ultralow resistance has been increased.

As an evaluation method for BMDs, an infrared light scattering tomograph method of irradiating a substrate with infrared laser beams and observing light scattered by BMDs is known, but a penetration ratio of infrared light is lowered when an electrical resistivity of the substrate is low, and hence a measurement precision is greatly lowered when the electrical resistivity is less than 10 m$\Omega$·cm. Further, when the electrical resistivity of the substrate becomes 5 m$\Omega$·cm or below, BMDs cannot be substantially evaluated based on the infrared light scattering tomograph method.

As a method of chemically detecting crystal defects by preferential etching, a Secco fluid, a Sirtl fluid, and a Wright fluid are well known. However, these preferential etchants contain harmful chrome, and hence a waste liquid process becomes a problem. Thus, a so-called chromeless etchant which does not contain chrome has been developed (Japanese Unexamined Patent Application Publication No. 59-94828, Japanese Unexamined Patent Application Publication No. 07-263429, and Japanese Unexamined Patent Application Publication No. 2004-235350).

However, in case of etchant compositions disclosed in Japanese Unexamined Patent Application Publication No. 59-94828 and Japanese Unexamined Patent Application Publication No. 07-263429, preferentially etching a substrate having an ultralow resistance to detect BMDs is difficult. Furthermore, an etching method disclosed in Japanese Unexamined Patent Application Publication No. 2004-235350 is a crystal defects evaluation method for an SOI substrate, and optimization of preferentially etching a surface of a substrate having an ultralow resistance to elicit BMDs is not performed.

In JIS H0609:1999, solutions A to D containing a hydrofluoric acid, a nitric acid, an acetic acid, and water are specified as preferential etchants containing no chrome. However, they are effective with respect to a silicon single crystal substrate having an electrical resistivity higher than 20 m$\Omega$·cm, but their preferential etching properties are very low with respect to an ultralow-resistance silicon single crystal substrate having an electrical resistivity that is less than 10 m$\Omega$·cm, and they are not suitable for evaluation of BMDs.

DISCLOSURE OF THE INVENTION

Thus, in view of the above-explained problem, it is an object of the present invention to provide a preferential etching method which can elicit, evaluate, and utilize crystal defects, especially BMDs in an ultralow-resistance silicon single crystal substrate having an electrical resistivity less than 10 m$\Omega$·cm, which cannot be readily detected by conventional techniques, by performing preferential etching using a chromeless etchant containing no harmful chrome, and also provide a silicon single crystal substrate whose effectiveness can be confirmed by using the preferential etching method.

To achieve the aforementioned object, according to the present invention, there is provided a preferential etching method wherein a silicon single crystal substrate having an electrical resistivity which is less than 10 m$\Omega$·cm is etched at a rate higher than 0.1 µm/min by using a preferential etchant containing at least a hydrofluoric acid whose composition by volume falls within the range of 0.02 to 0.1, a nitric acid whose composition by volume falls within the range of 0.5 to 0.6, an acetic acid whose composition by volume falls within the range of 0.2 to 0.25, and water, thereby eliciting BMDs on a surface of the silicon single crystal substrate.

When etching the surface of the ultralow-resistance silicon single crystal substrate having an electrical resistivity which is less than 10 mΩ·cm in this manner, using the highly preferential etchant because of a large ratio of the nitric acid which is an oxidant and has an effect of increasing an oxidation rate at crystal defect parts enables demonstrating excellent preferential etching performance. Further, when etching is performed at a rate higher than 0.1 μm/min by using the preferential etchant containing at least the hydrofluoric acid whose composition by volume falls within the range of 0.02 to 0.1, the nitric acid whose composition by volume falls within the range of 0.5 to 0.6, the acetic acid whose composition by volume falls within the range of 0.2 to 0.25, and water, BMDs in the ultralow-resistance silicon single crystal substrate can be efficiently and precisely elicited. In particular, adjusting an etching rate for the silicon single crystal substrate to become higher than 0.1 μm/min is effective to greatly elicit BMDs to a level facilitating detection using an optical microscope. As a result, crystal defects, especially BMDs in the ultralow-resistance silicon single crystal substrate having an electrical resistivity that is less than 10 mΩ·cm, which cannot be readily detected by a conventional technology, can be elicited and evaluated by performing preferential etching using a chromeless etchant containing no harmful chrome. It is to be noted that, as the etchant and an etchant explained below, those containing a hydrofluoric acid having a concentration of 49 to 50 weight %, a nitric acid having a concentration of 60 to 62 weight %, and an acetic acid having a concentration of 99 to 100 weight % are used, and their volume ratios are set to the above-explained ratios.

Moreover, it is preferable to etch the silicon single crystal substrate at a rate of 1.5 μm/min or below.

When the etching rate is adjusted to 1.5 μm/min or below, a boundary between an etch pit and a substrate surface becomes clear without sag, thereby facilitating detection using an optical microscope.

Further, adding an iodine or an iodide to the preferential etchant is preferable.

When the iodine or the iodide is added in this manner, an etching rate can be increased, and stains that are an unsaturated oxide film and a stain film can be suppressed from being produced on a substrate surface during etching. It is to be noted that the electrical resistivity of an usually unavailable ultralow-resistance substrate is not smaller than 0.1 m·Ω·cm.

Furthermore, the present invention can provide a preferential etchant that is an etchant which is used for preferential etching of a surface of a silicon single crystal substrate whose electrical resistivity is less than 10 mΩ·cm to elicit BMDs on the substrate surface, wherein the etchant is a mixture in which at least a hydrofluoric acid, a nitric acid, an acetic acid, and water are mixed, a volume ratio of the nitric acid in the etchant is maximum, and an etching rate for the silicon single crystal substrate is adjusted to become larger than 0.1 μm/min.

In case of using preferential etchant having such characteristics, since a ratio of the nitric acid that is an oxidant and has an effect of increasing an oxidation rate at the crystal defect parts is large, selectivity of etching is high, excellent preferential etching performance can be demonstrated and BMDs can be elicited on a substrate surface when etching a surface of an ultralow-resistance silicon single crystal substrate whose electrical resistivity is less than 10 mΩ·m. Furthermore, since such a preferential etchant does not contain harmful chrome, an effect on a global environment or human bodies or a waste liquid does not have to considered, and the ultralow-resistance silicon single crystal substrate can be readily preferentially etched. Moreover, an etching rate for the silicon single crystal substrate is adjusted to become larger than 0.1 μl/min to greatly elicit BMDs to a level facilitating detection using an optical microscope.

At this time, it is preferable for the etchant to contain at least a hydrofluoric acid whose composition by volume falls within the range of 0.02 to 0.1, a nitric acid whose composition by volume falls within the range of 0.5 to 0.6, an acetic acid whose composition by volume falls within the range of 0.2 to 0.25, and water.

When compositions by volume in the etchant are adjusted at such a ratio, the ultralow-resistance silicon single crystal substrate can be preferentially etched with a high efficiency and precision by using the highly preferential etchant having an appropriate etching rate.

Moreover, it is preferable for an etching rate of the silicon single crystal substrate to be adjusted to become 1.5 μm/min or below.

When the etching rate is adjusted in this manner, boundaries between each of the BMDs and a substrate surface can become clear without sag, thereby facilitating detection using an optical microscope.

Additionally, it is preferable to add an iodine or an iodide to the preferential etchant.

When the iodine or the iodide is added in this manner, the etching rate can be increased.

Further, the present invention can provide crystal defects evaluation method for a silicon single crystal substrate that is a method of evaluating BMDs in the silicon single crystal substrate by immersing the silicon single crystal substrate whose electrical resistivity is less than 10 mΩ·cm in a preferential etchant to preferentially etch a substrate surface and eliciting the BMDs formed in the substrate on the substrate surface to be observed, wherein preferential etching of the silicon single crystal substrate is performed based on the preferential etching method according to the present invention, and then the BMDs on the surface of the silicon single crystal substrate are evaluated.

When the preferential etching method for the silicon single crystal substrate according to the present invention is used in this manner, crystal defects, especially BMDs formed in an ultralow-resistance silicon single crystal substrate whose electrical resistivity is less than 10 mΩ·cm, which cannot be readily detected by a conventional technology, can be elicited on the substrate surface, thereby enabling evaluation based on observation.

At this time, it is preferable to perform a heat treatment with respect to the silicon single crystal substrate before effecting the preferential etching.

When the heat treatment is performed with respect to the ultralow-resistance silicon single crystal substrate before effecting the preferential etching in this manner, for example, oxygen contained in a crystal is precipitated, and bulk micro defects (BMDs) made of oxide precipitates are formed in the substrate. Each distortion of crystal lattices that captures impurity, e.g., a heavy metal is included in each circumference of the BMDs to no small extent, which contributes to an increase in gettering performance of the silicon single crystal substrate. Furthermore, when the heat treatment is carried out, the ultralow-resistance silicon single crystal substrate having BMDs formed therein is preferentially etched by the preferential etching method according to the present invention, and then crystal defects on the ultralow-resistance silicon single crystal substrate surface can be evaluated.

When the preferential etching method for the silicon single crystal substrate according to the present invention is used in this manner, characteristics of BMDs in an ultra-low resistance region which cannot be detected by a conventional technology can be evaluated and utilized. As a result, the present invention can provide a silicon single crystal substrate wherein boron is doped in the silicon single crystal substrate in such a manner that an electrical resistivity becomes 2 m$\Omega$·cm or below and the silicon single crystal substrate has a BMD density of $1 \times 10^{10}$ cm$^{-3}$ or above.

Here, in an ultralow-resistance silicon single crystal substrate in which boron is doped, when its electrical resistivity is reduced to 2 m$\Omega$·cm or below, slightly changing the electrical resistivity enables greatly varying a BMD density. That is, when using the silicon single crystal substrate in which boron is doped in such a manner that the electrical resistivity becomes 2 m$\Omega$·cm or below and which has a BMD density of $1 \times 10^{10}$ cm$^{-3}$ or above from which high gettering performance can be expected, just slightly changing the electrical resistivity enables varying a density of oxide precipitate while maintaining substantially electrical resistivity characteristics nearly constant without changing precipitation heat treatment conditions or oxygen concentrations. It is to be noted that the BMD density just monotonously increases with a reduction in the electrical resistivity in a region where the electrical resistivity is higher than 2 m$\Omega$·cm.

Furthermore, according to the present invention, it is preferable for a BMD density of the silicon single crystal substrate to be equal to or below $1 \times 10^{11}$ cm$^{-3}$.

When the BMD density is equal to or below $1 \times 10^{11}$ cm$^{-3}$ in this manner, there is no warp of the silicon single crystal substrate due to too high BMD density, an ultralow resistance enables providing high gettering performance, and functional and high practicality can be maintained.

As explained above, the preferential etching method according to the present invention enables evaluating and utilizing characteristics of crystal defects, especially BMDs in an ultralow-resistance silicon single crystal substrate whose electrical resistivity is less than 10 m$\Omega$·cm, which cannot be readily detected by conventional techniques, by performing preferential etching using a chromeless etchant containing no harmful chrome.

BEST MODES FOR CARRYING OUT THE INVENTION

Hereinafter, embodiments of a preferential etching method and a silicon single crystal substrate according to the present invention will be explained with reference to the accompanying drawings, but the present invention is not restricted thereto.

Figure 1:
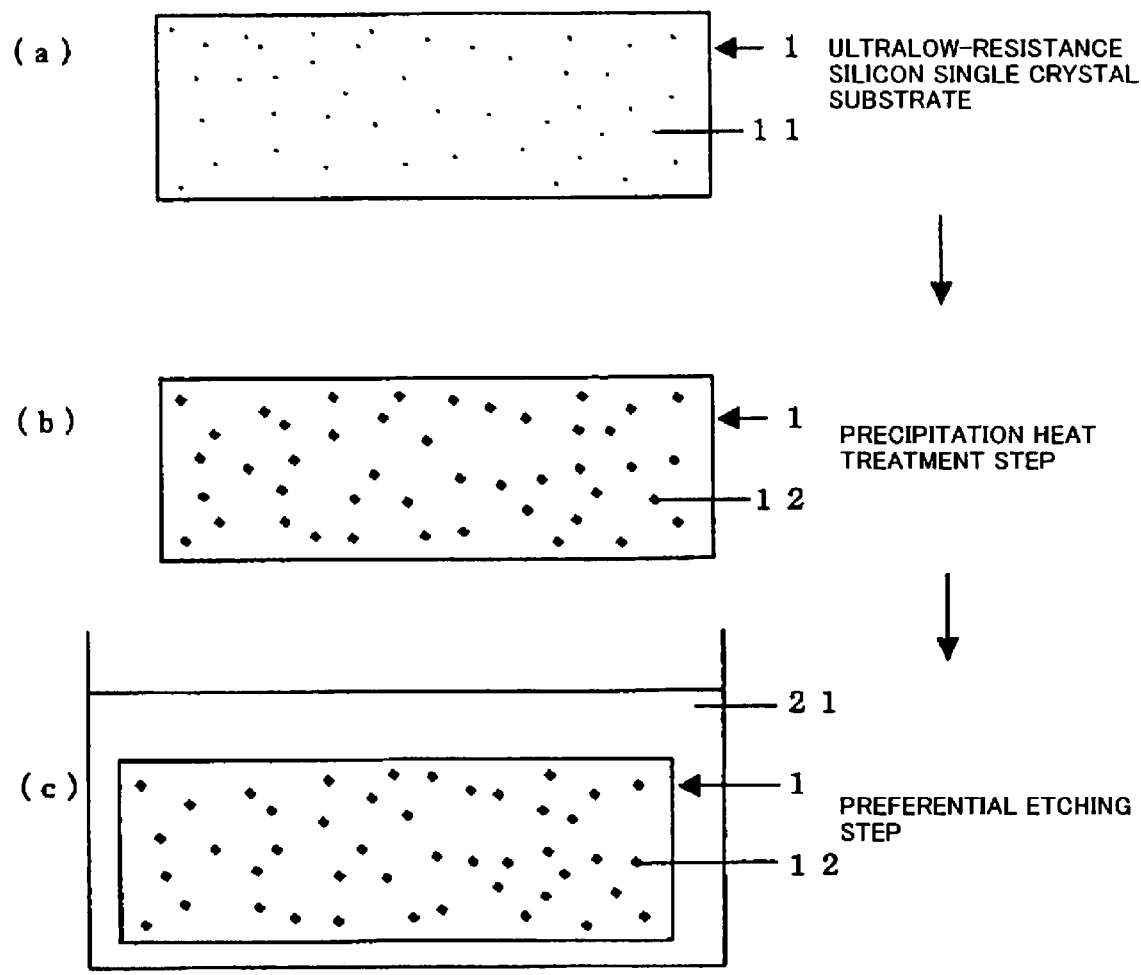
FIG. 1 is a schematic process drawing showing a preferential etching method for a silicon single crystal substrate according to the present invention.

FIG. 1 is a schematic process drawing showing a preferential etching method for a silicon single crystal substrate according to the present invention. First, as shown in FIG. 1(a), a silicon single crystal substrate 1 in which boron is added and which has an electrical resistivity that is less than 10 m$\Omega$·cm is prepared by a CZ method. Oxide precipitate nuclei 11 which are formed in a period when a silicon single crystal grows in a crystal pulling process and is cooled to a room temperature are present in the silicon single crystal substrate 1.

Then, the ultralow-resistance silicon single crystal substrate 1 having boron added thereto is put into a non-illustrated heat treatment furnace, a low-temperature heat treatment in a temperature range of, e.g., 450° C. to 750° C. is carried out in an oxidizing atmosphere for a predetermined time to sufficiently form the oxide precipitate nuclei 11, and an intermediate-temperature heat treatment at a temperature that is not lower than 800° C. and less than 1100° C. is performed, thereby enabling the oxide precipitate nuclei 11 to grow into BMDs 12 (FIG. 1(b): a precipitation heat treatment step). As a result, the BMDs 12 are formed in the substrate 1. Each distortion of crystal lattices that captures an impurity, e.g., heavy metal is included in each circumference of the BMDs to no small extent, which contributes to an increase in gettering performance of the silicon single crystal substrate 1.

Although the oxidizing atmosphere in which the low-temperature heat treatment is carried out can be an atmosphere obtained by, e.g., diluting dry oxygen with an inert gas, e.g., nitrogen, it may be an atmosphere containing dry oxygen 100%. Furthermore, it is preferable to set a temperature and a time of each of the low-temperature heat treatment and the intermediate-temperature heat treatment in such a manner that a density of the oxide precipitates 12 in the ultralow-resistance silicon single crystal substrate 1 becomes at least $5 \times 10^{9}$ cm$^{-3}$ or above, or desirably $1 \times 10^{10}$ cm$^{-3}$ or above and $1 \times 10^{11}$ cm$^{-3}$ or below. That is because sufficient gettering performance cannot be expected in case of less than $5 \times 10^{9}$ cm$^{-3}$, and the substrate warps in case of exceeding $1 \times 10^{11}$ cm$^{-3}$.

Moreover, the ultralow-resistance silicon single crystal substrate 1 having boron added thereto is immersed in a preferential etchant 21 to preferentially etch a substrate surface, and the BMDs are elicited on the surface of the substrate 1. The present invention uses, as the etchant, the preferential etchant 21 which contains at least a hydrofluoric acid whose composition by volume falls within the range of 0.02 to 0.1, a nitric acid whose composition by volume falls within the range of 0.5 to 0.6, an acetic acid whose composition by volume falls within the range of 0.2 to 0.25, and water and which is adjusted in such a manner that an etching rate for the ultralow-resistance silicon single crystal substrate 1 becomes larger than 0.1 μm/min (FIG. 1(c): a preferential etching step). The preferential etchant 21 contains at least the hydrofluoric acid whose composition by volume falls within the range of 0.02 to 0.1, the nitric acid whose composition by volume falls within the range of 0.5 to 0.6, the acetic acid whose composition by volume falls within the range of 0.2 to 0.25, and water. As a result, the BMDs can be efficiently and highly-precisely elicited on the surface of the ultralow-resistance silicon single crystal substrate 1 by using the preferential etchant 21 that is a highly preferential etchant having an appropriate etching rate. Specifically, the compositions by volume can be set to, e.g., 0.04 of the hydrofluoric acid, 0.54 of the nitric acid, 0.21 of the acetic acid, and water having the same composition by volume as the acetic acid.

As a result, characteristics of crystal defects, especially BMDs in the ultralow-resistance silicon single crystal substrate 1 whose electrical resistivity is less than 10 m$\Omega$·cm, which cannot be readily detected by conventional techniques, can be evaluated by performing preferential etching using the chromeless preferential etchant 21 containing no harmful chrome.

Moreover, in the ultralow-resistance silicon single crystal substrate 1 in which boron is doped, when its electrical resistivity is reduced to 2 mΩ·cm or below, slightly changing the electrical resistivity enables greatly varying a BMD density. When the preferential etching method according to the present invention is used, boron is doped in such a manner that the electrical resistivity becomes 2 mΩ·cm or below, and the silicon single crystal substrate having the BMD density of $1 \times 10^{11}$ cm$^{-3}$ or above from which high gettering performance can be expected can be found, thereby obtaining the silicon single crystal substrate whose BMD density is varied while maintaining substantial electrical resistivity characteristics nearly constant without changing precipitation heat treatment conditions or an oxygen concentration.

It is to be noted that this tendency appears when a dopant is boron, and a density of oxide precipitate is reduced as the electrical resistivity of the substrate is lowered in case of an n-type dopant. Additionally, the etching rate for the silicon single crystal substrate 1 is adjusted to become higher than 0.1 μm/min in order to greatly elicit each BMD to a level facilitating detection using an optical microscope.

Furthermore, it is preferable to adjust the etching rate to become higher than 0.1 μm/min and, on the other hand, to become 1.5 μm/min or below, and a boundary between each BMD and the substrate surface thereby becomes clear without sag, thus facilitating detection using an optical microscope. More preferably, the etching rate is controlled to fall within the range of 0.5 μm/min to 1.0 μm/min.

The etching rate is obtained by immersing a silicon single crystal substrate (a test substrate) having the same conductivity type, plane orientation and resistivity as those of a silicon single crystal substrate as a measurement target in the preferential etchant 21 for a predetermined time to perform etching, measuring a thickness of the test substrate before and after etching to obtain an etched thickness on one side, and dividing this value by an etching time.

When the etching rate is low, a dummy silicon single crystal substrate may be first immersed to be etched in order to stabilize the etching rate, and then a target silicon single crystal substrate may be etched. When a plurality of silicon single crystal substrates are immersed as dummy substrates in the preferential etchant 21, the preferential etchant 21 can be activated. When air bubbles begin to be produced from the dummy substrates immersed in the preferential etchant 21, an appropriate etching rate, i.e., an etching rate that is higher than 0.1 μm/min and equal to or below 1.5 μm/min can be obtained. Although a temperature is not restricted to a specific value, it is preferable to maintain the temperature constant so as to enable controlling the etching rate in the above-explained range. Moreover, the etching rate may be increased by adding an iodine or an iodide.

When the preferential etching method according to the present invention is used in this manner, crystal defects, especially BMDs 12 formed on a surface of the ultralow-resistance silicon single crystal substrate 1 whose electrical resistivity is less than 10 mΩ·cm, which cannot be readily detected by conventional techniques, can be elicited as an etch pit on the substrate surface to be observed, thereby enabling evaluation.

Evaluation of the preferentially etched surface of the silicon single crystal substrate is not restricted in particular, and it can be appropriately selected in accordance with a purpose, but observation using an optical microscope and visual observation using a collimated light, e.g., a high-luminance halogen lamp can be likewise performed.

The conductivity type of the silicon single crystal substrate 1 as an evaluation target in the present invention may be an n-type in which arsenic is doped instead of a p-type in which boron is doped as long as this substrate is the ultralow-resistance silicon single crystal substrate 1 whose electrical resistivity becomes less than 10 mΩ·cm, especially 0.1 to 10 mΩ·cm.

The present invention will now be more specifically explained hereinafter with reference to examples and comparative examples, but the present invention is not restricted thereto.

EXAMPLE 1

Figure 2:
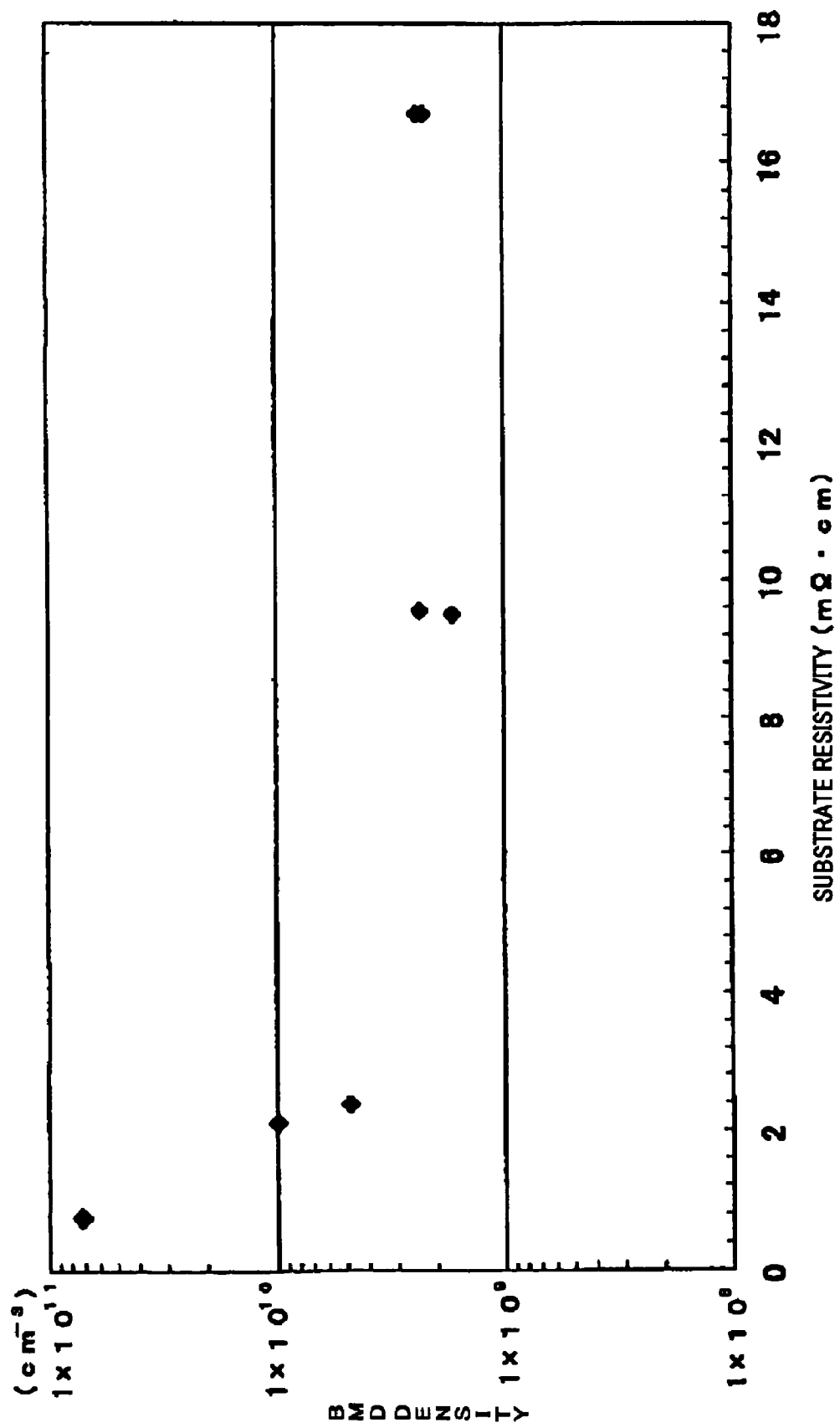
FIG. 2 is a graph showing a relationship between an electrical resistivity and a BMD density of a substrate in which boron is doped (Example 1)

First, a preferential etchant liquid 21 which contains a hydrofluoric acid whose composition by volume is 0.04, a nitric acid whose composition by volume is 0.54, an acetic acid whose composition by volume is 0.21, and water whose composition by volume is the same as that of the acetic acid and in which a potassium iodide is added, and a silicon single crystal substrate 1 which has boron doped therein at a high concentration and has a plane orientation (100) in which an electrical resistivity is oscillated in the range of 0.75 mΩ·cm to 16.7 mΩ·cm are prepared. Then, the silicon single crystal substrate 1 is subjected to a low-temperature heat treatment at 700° C. for one hour and an intermediate-temperature heat treatment at 1050° C. for eight hours, then cleaving is performed to expose a substrate cross section, and the silicon single crystal substrate 1 is immersed in the preferential etchant 21 at an etching rate of 0.8 μm/min for 90 seconds. Further, the preferentially etched cleaved surface is observed by using an optical microscope having a magnifying power of 1000, thereby measuring a density of BMDs 12 (FIG. 2).

As a result, the density of the BMDs 12 increases in a region where the resistivity of the silicon single crystal substrate 1 is 2 mΩ·cm or below, and the density falling within the range of $1 \times 10^{10}$ cm$^{-3}$ to $1 \times 10^{11}$ cm$^{-3}$ was detected.

According to the present invention, the ultralow-resistance silicon single crystal substrate 1 having boron doped therein can be preferentially etched to evaluate the BMD density in this manner. Furthermore, in the ultralow-resistance silicon single crystal substrate 1 having boron doped therein, it can be understood that a small change in the electrical resistivity enables greatly varying the BMD density when the electrical resistivity is reduced to 2 mΩ·cm or below.

As a result, it can be understood that, when the silicon single crystal substrate 1 in which boron is doped in such a manner that the electrical resistivity becomes 2 mΩ·cm or below and which has the BMD density equal to above $1 \times 10^{10}$ cm$^{-3}$ from which high gettering performance can be expected is used, the silicon single crystal substrate in which a BMD density is changed while maintaining substantial electrical resistivity characteristics nearly constant can be obtained without using precipitation heat treatment conditions or an oxygen concentration.

EXAMPLE 2

Figure 3:
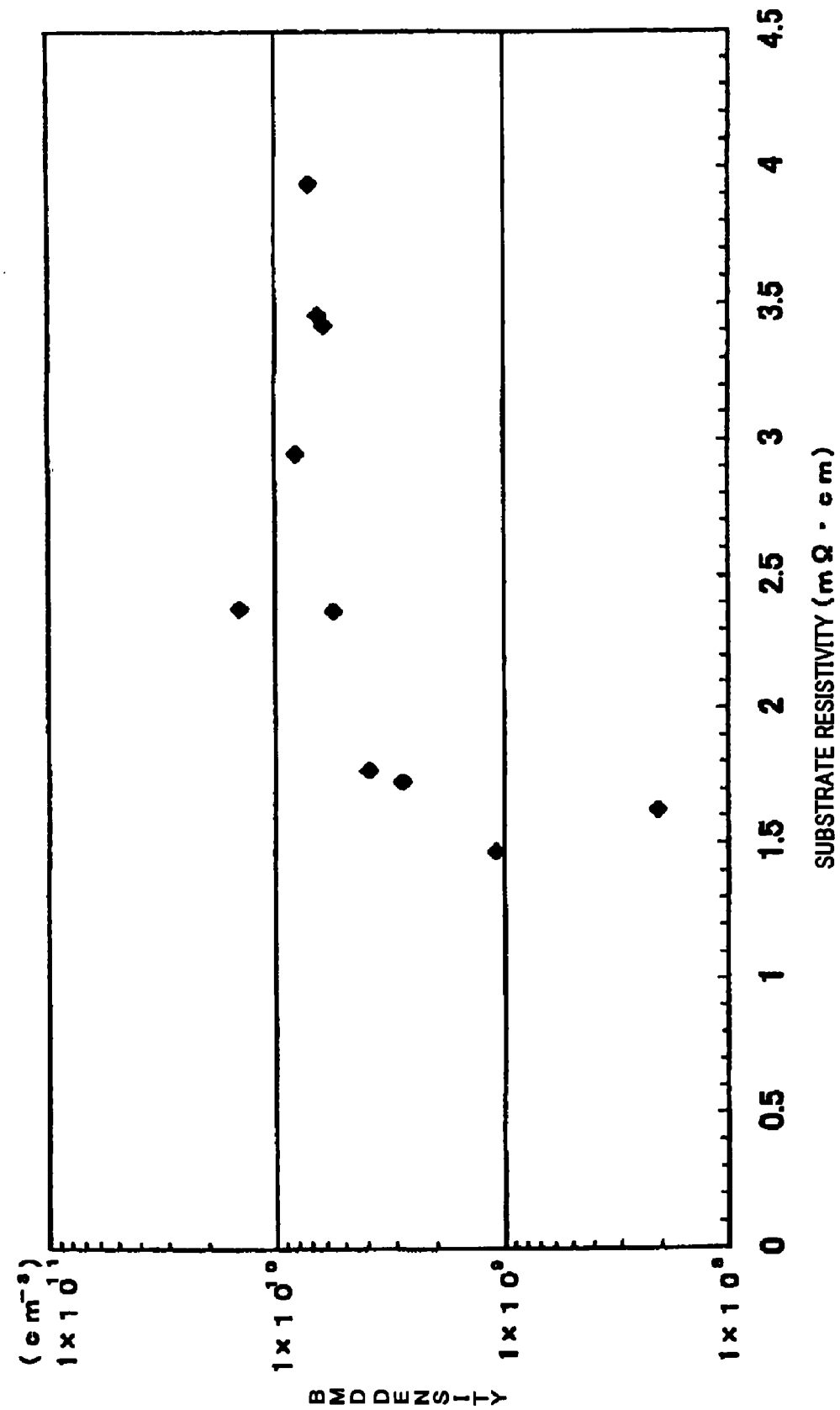
FIG. 3 is a graph showing a relationship between an electrical resistivity and a BMD density of a substrate in which arsenic is doped (Example 2).

A silicon single crystal substrate 1 in which arsenic is doped at a high concentration and which has a plane orientation (111) in which an electrical resistivity is oscillated in the range of 1.5 mΩ·cm to 3.9 Ω·cm is subjected to a low-temperature heat treatment at 600° C. for eight hours and an intermediate-temperature heat treatment at 1050° C. for 16 hours, then angle polishing is performed to expose a substrate cross section, and the silicon single crystal substrate 1 is immersed in the same etchant 21 as that in Example 1 at an etching rate of 0.6 μm/min for three minutes. Angle-polished surface already subjected to preferential etching is observed by using an optical microscope with a magnifying power of 1000 to measure a density of BMDs 12 (FIG. 3).

As a result, it can be understood that the density of the BMDs 12 is precipitously reduced in a region where the electrical resistivity of the silicon single crystal substrate 1 is 2 mΩ·cm or below and, on the other hand, the BMD density is maintained at $5 \times 10^9$ cm$^{-3}$ or above in a region where the electrical resistivity is 2 mΩ·cm or below, thereby expecting high gettering performance.

COMPARATIVE EXAMPLE 1

When an etchant which contains a hydrofluoric acid whose composition by volume is 0.04, a nitric acid whose composition by volume is 0.68, an acetic acid whose composition by volume is 0.14, and water whose composition by volume is the same as that of the acetic acid (hydrofluoric acid:nitric acid:acetic acid:water=1:15:3:3) and has no potassium iodide added thereto is used to etch a silicon single crystal substrate 1 in which boron is doped to obtain an electrical resistivity of 9.6 mΩ·cm at an etching rate of 0.09 μm/min and the silicon single crystal substrate 1 is observed under the same conditions as those in Example 1, BMDs 12 cannot be specified. As a result, it can be understood that the BMDs 12 cannot be detected when an ultralow-resistance silicon single crystal substrate in which boron is doped is etched by using an etchant having inappropriate compositions by volume at an etching rate of 0.1 μm/min or below.

It is to be noted that the present invention is not restricted to the foregoing embodiments. The embodiments are just examples, and those which have substantially the same structure as technical ideas disclosed in claims of the present invention and provide the similar functions and effects are included in a technical scope of the present invention.

The invention claimed is:

1. A preferential etching method wherein a preferential etchant, which contains at least
    a hydrofluoric acid having a concentration of 49 to 50 weight %,
    a nitric acid having a concentration of 60 to 62 weight %,
    an acetic acid having a concentration of 99 to 100 weight %, and
    water, where a volume ratio of hydrofluoric acid, nitric acid and acetic acid in the etchant composition falls within the range of 0.02-0.1:0.5-0.6:0.2-0.25, is used to etch a silicon single crystal substrate whose electrical resistivity is less than 10 mΩ·cm at a rate higher than 0.1 μm/min, thereby eliciting bulk micro defects on a surface of the silicon single crystal substrate.

2. The preferential etching method according to claim 1, wherein the silicon single crystal substrate is etched at a rate equal to or below 1.5 μm/min.

3. The preferential etching method according to claim 1, wherein an iodine or an iodide is added to the preferential etchant.

4. The preferential etching method according to claim 2, wherein an iodine or an iodide is added to the preferential etchant.

5. The preferential etching method according to claim 1, wherein the electrical resistivity of the silicon single crystal substrate is equal to or above 0.1 mΩ·cm.

6. The preferential etching method according to claim 2, wherein the electrical resistivity of the silicon single crystal substrate is equal to or above 0.1 mΩ·cm.

7. The preferential etching method according to claim 3, wherein the electrical resistivity of the silicon single crystal substrate is equal to or above 0.1 mΩ·cm.

8. The preferential etching method according to claim 4, wherein the electrical resistivity of the silicon single crystal substrate is equal to or above 0.1 mΩ·cm.

* * * * *